(12) United States Patent
Kim

(10) Patent No.: US 7,675,052 B2
(45) Date of Patent: Mar. 9, 2010

(54) NONVOLATILE MEMORY DEVICE AND FABRICATION METHOD THEREOF

(75) Inventor: Tae Hoon Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 230 days.

(21) Appl. No.: 11/769,982

(22) Filed: Jun. 28, 2007

(65) Prior Publication Data
US 2008/0073636 A1    Mar. 27, 2008

(30) Foreign Application Priority Data
Sep. 22, 2006    (KR)    ........................ 10-2006-0092359

(51) Int. Cl.
*H01L 47/00*    (2006.01)
(52) U.S. Cl. .................... 257/2; 257/4; 257/E47.001
(58) Field of Classification Search .............. 257/2, 257/3, 4, 295, E47.001
See application file for complete search history.

(56) References Cited

U.S. PATENT DOCUMENTS 6,621,730 B1    9/2003    Lage

2004/0178404 A1    9/2004    Ovshinsky
2006/0003263 A1    1/2006    Chang .................... 430/311
2006/0170027 A1    8/2006    Lee et al.
2006/0208847 A1    9/2006    Lankhorst et al. .............. 338/9
2006/0273298 A1*    12/2006    Petti .............................. 257/5

FOREIGN PATENT DOCUMENTS

CN    1409399    4/2003
CN    1638125    7/2005

OTHER PUBLICATIONS

Notification of First Office Action for Chinese Application No. 200710129486.9, dated Mar. 6, 2009.

* cited by examiner

*Primary Examiner*—Hoai v Pham
(74) *Attorney, Agent, or Firm*—Marshall, Gerstein & Borun LLP

(57) ABSTRACT

A nonvolatile memory device and its fabrication method of the present invention may ensure a margin of the threshold drive voltage during a design process of the device by forming a resistance layer determining phase of ReRAM along an upper edge of a lower electrode, and improve operating characteristics of the device.

8 Claims, 5 Drawing Sheets

NONVOLATILE MEMORY DEVICE AND FABRICATION METHOD THEREOF

CROSS-REFERENCE(S) TO RELATED APPLICATION

The present application claims the benefit of priority to Korean patent application number 10-2006-92359, filed on Sep. 22, 2006, the entire contents of which are incorporated herein by reference.

BACKGROUND OF THE INVENTION

The present application relates to a nonvolatile memory device and a fabrication method thereof; and, more particularly, to a technology of resistance switching random access memory (ReRAM) using phase changes in resistance.

In general, a semiconductor memory device includes many memory cells being circuitly connected. One exemplary semiconductor memory device is a dynamic random access memory (DRAM). A typical DRAM unit memory cell consists of one switch and one capacitor, and provides benefits such as a high degree of integration and a fast operating speed.

However, since the DRAM memory cell makes two states "0" and "1" with respect to a change, it loses all stored data when power is turned off (i.e., a volatile memory device), so it is difficult to retain data.

To facilitate data retention, research on a new memory technology attempts to make a binary state corresponding to "0" and "1" in DRAM by using a new variable, not the charge.

Nonvolatile memory devices now being studied include magnetic random access memory (MRAM), ferroelectric random access memory (FRAM), phase-change ransom access memory (PRAM) and so on.

MRAM stores data using the change in magnetization direction at a tunnel junction, and FRAM stores data using polarization of ferroelectrics. Although each has merits as well as defects, both are basically known for a high integration density, a high operating speed, and an ability of low power operation, and have the potential to provide good data retention.

PRAM stores data using a change in resistance value in accordance with the phase change of a specific material, and consists of one resistor and one switch (transistor). The resistor used for PRAM is a chalcogenide resistor, which exists in a crystal state or in an amorphous state, depending on a formation temperature. Because resistance in the amorphous state is greater than that in the crystal state, a memory device may be fabricated using these characteristics. When a DRAM process is used in the fabrication of the PRAM, an etching operation may be difficult and may even take a long time. In addition, the memory device uses a transistor or diode for switching, but its structure is complicate and an accurate switching operation is not easy. A simplified structure for the memory device is preferred and is being sought.

Studies and development for resistance switching random access memory (ReRAM), where high and low states of a resistance value are reproducibly switched in accordance with an applied voltage from outside, are making rapid progress. For example, one such ReRAM device exists as an insulator in its intrinsic state, but its phase turns to a metal or semiconductor state due to an applied voltage from outside, exhibiting changes in physical properties.

SUMMARY OF THE INVENTION

A nonvolatile memory device and its fabrication method may ensure a margin of the threshold drive voltage during a design process of the device by forming a resistance layer that determines phase of ReRAM along an upper edge of a lower electrode.

For example, a nonvolatile memory device may include a first electrode; a first resistance layer formed along an edge of the first electrode; a second resistance layer filled inside the first resistance layer; and a second electrode formed over the first and second resistance layers.

In an exemplary embodiment, the first electrode and the second electrode are composed of platinum group elements including platinum (Pt), iridium (Ir) and their metallurgical equivalents.

Preferably, the first resistance layer is composed of an oxide containing niobium (Nb), and for example an oxide consisting of $NbO_2$ or $Nb_2O_5$.

The second resistance layer may be composed of a material having a higher threshold drive voltage for switching phase than the first resistance layer. Preferably, the second resistance layer comprises an oxide containing aluminum (Al) that consists mainly of $Al_2O_3$.

A fabrication method of a nonvolatile memory device may include forming a first interlayer insulating film including a first electrode over a part of a semiconductor substrate; forming a second interlayer insulating film including a contact hole exposing the first electrode over a part of the first interlayer insulating film; forming a first resistance layer on sidewalls of the contact hole; forming a second resistance layer filling up an inside of the first resistance layer; forming a second electrode over the first and second resistance layers; and forming a third interlayer insulating film with a contact plug overlapping with the first electrode over a part of the second electrode.

Preferably, the first electrode and the upper electrode are composed of platinum group elements including platinum (Pt), iridium (Ir) and their metallurgical equivalents.

The first resistance layer may be an oxide, and for example, an oxide containing niobium (Nb) that includes $NbO_2$ or $Nb_2O_5$. In addition, the first resistance layer may be formed by a chemical vapor deposition (CVD) process.

Meanwhile, the second resistance layer may be a material having a higher threshold drive voltage for switching phase than the first resistance layer. Preferably, the second resistance layer is composed of an oxide containing aluminum (Al), and for example and oxided that includes $Al_2O_3$.

Moreover, the second resistance layer may be formed by a chemical vapor deposition (CVD) process.

Therefore, the nonvolatile memory device and its fabrication method of the present invention may ensure a margin of the threshold drive voltage during a design process of the device by forming a resistance layer determining phase of ReRAM along the upper edge of the lower electrode, and improve operating characteristics of the device.

Other advantages and features of the invention will be understood from the following description and will also be appreciated and understood from the herein described embodiments of the invention more clearly. Further, advantages of the invention will readily be seen that they can be realized by the structures and methods and combination thereof specified in the claims.

DESCRIPTION OF SPECIFIC EMBODIMENTS

Hereinafter, preferred embodiments of the present invention will be set forth in detail with reference to the accompanying drawings so that those skilled in the art can easily carry out the invention.

Figure 1:
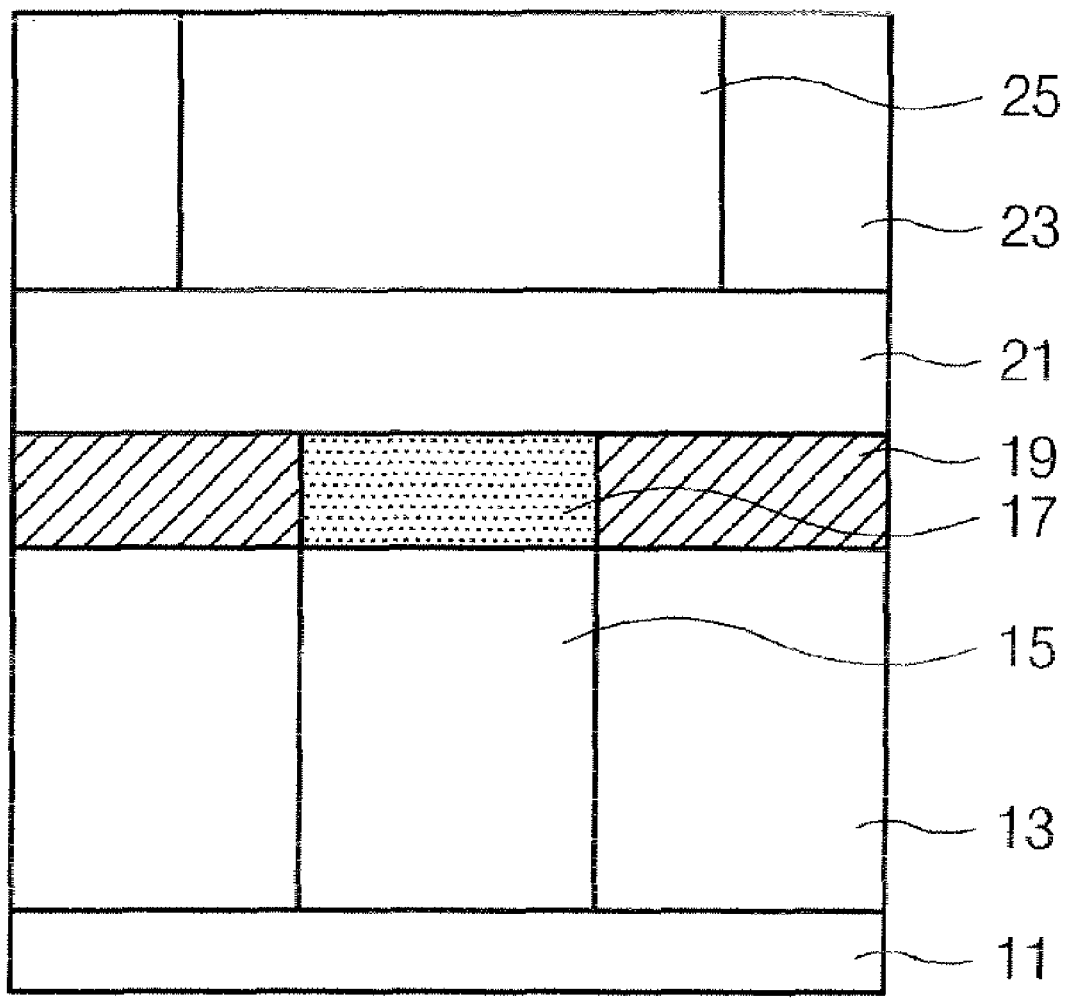
FIG. 1 a cross-sectional view showing a method for fabricating a nonvolatile memory device.

FIG. 1 is a cross-sectional view showing a method for fabricating a nonvolatile memory device. A first interlayer insulating film 13 is formed on an upper part of a semiconductor substrate 11. The first interlayer insulating film 13 is etched by a photo etching process using a contact mask that defines a lower electrode, to form a lower electrode contact hole (not shown). The lower electrode contact hole is filled up with a metal film to form a lower electrode 15.

A first resistance layer 17 is formed on an upper part of the lower electrode 15. A second resistance layer 19 is formed on an upper part of the first interlayer insulating film 13 exclusive of the first resistance layer 17. An upper electrode 21 is formed over the first and second resistance layers 17 and 19. A second interlayer insulating film 23 including a contact plug 25 is formed over the upper electrode 21.

Figure 2:
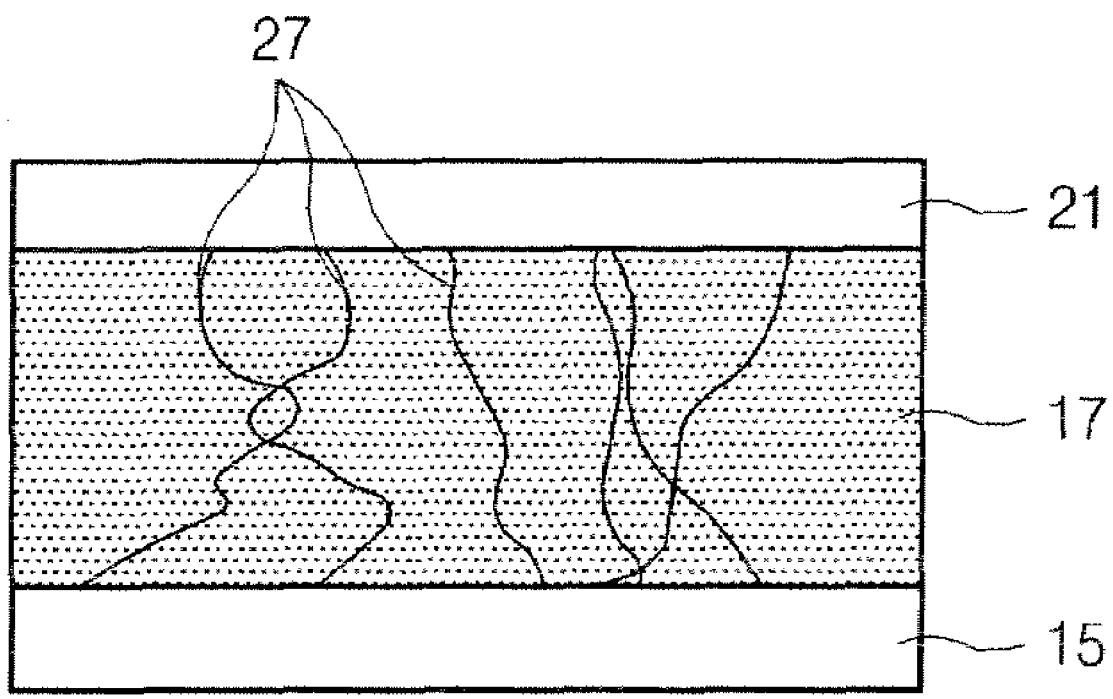
FIG. 2 is a plan view explaining the operating principles of a nonvolatile memory device.

FIG. 2 is a plan view explaining the operating principles of a nonvolatile memory device. As is apparent from the drawing, a ReRAM exists as an insulator ("0" resistance state) in its intrinsic state. However, when a voltage higher than a threshold drive voltage (Vt) is applied from outside through the contact plug 25, a current path 27 is formed inside the first resistance layer 17 and the phase of the ReRAM changes to a metal/semiconductor state ("1" resistance state).

Here, the threshold drive voltage (Vt) is a voltage sufficient to change the phase of ReRAM from an insulator state to a metal/semiconductor state. However, in case of the nonvolatile memory device and its fabrication method, the current path 27 is randomly formed inside the first resistance layer 17, resulting in a broad dispersion of the threshold drive voltage (Vt). Therefore, it is difficult to ensure a margin of the threshold drive voltage (Vt) during a design process of the device.

Figure 3:
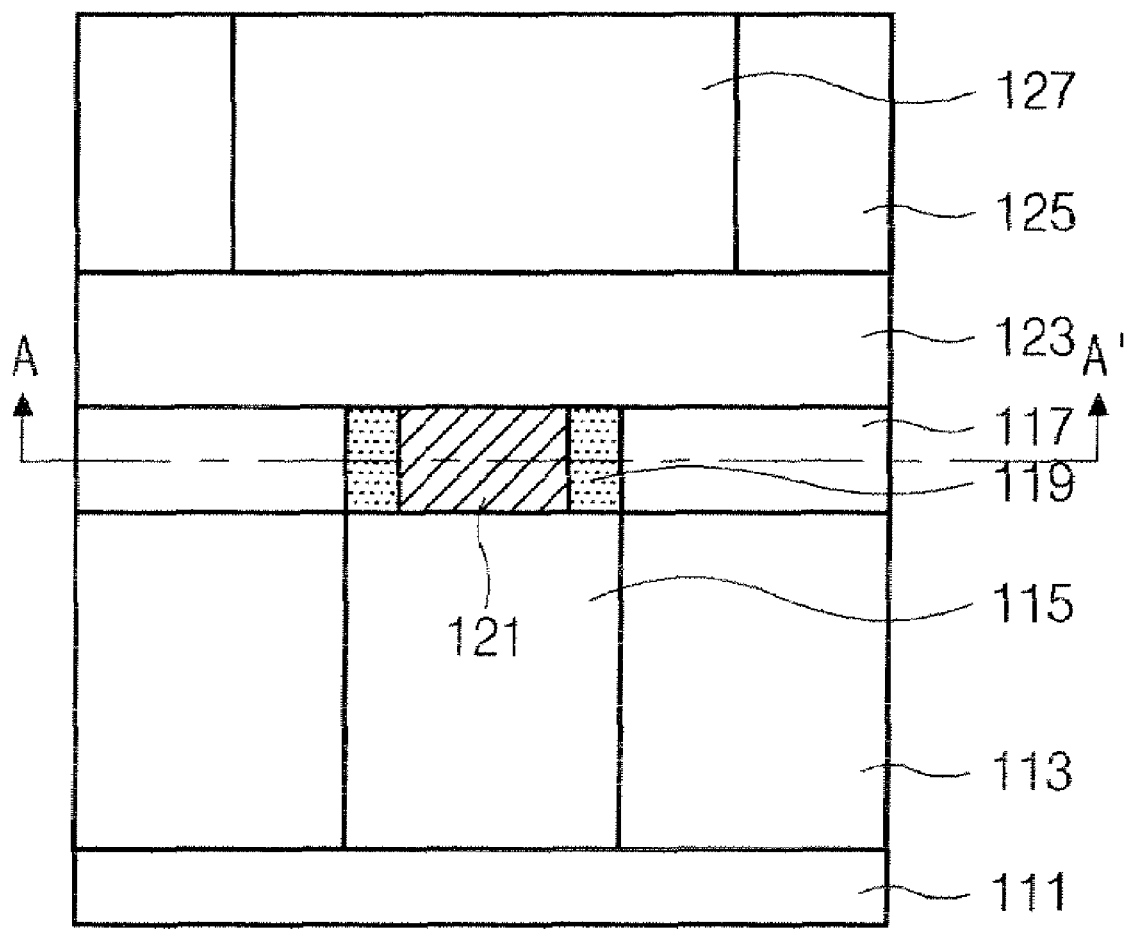
FIG. 3 is a cross-sectional view showing a method for fabricating a nonvolatile memory device, in accordance with a preferred embodiment of the present invention.

FIG. 3 is a cross-sectional view showing a method for fabricating a nonvolatile memory device, in accordance with a preferred embodiment of the present invention. A first interlayer insulating film 113 is formed on an upper part of a semiconductor substrate 111. The first interlayer insulating film 113 is etched by a photo etching process using a contact mask that defines a lower electrode, to form a first contact hole. The first contact hole is filled up with a metal film to form a lower electrode 115.

The metal film for the lower electrode is composed of a material selected from platinum group elements, for example, Pt and Ir. A second interlayer Insulating film 117 is formed on an upper part of the lower electrode 115. Then, the second interlayer insulating film 117 is etched by a photo etching process using a contact mask that defines a lower electrode, to form a second contact hole (not shown). A first resistance layer 119 is formed on sidewalls of the second contact hole.

The first resistance layer 119 is preferably formed of an oxide, and for example may be formed of an oxide containing niobium (Nb). More preferably, the oxide containing Nb consists mainly of $NbO_2$ or $Nb_2O_5$, and may be formed by a chemical vapor deposition (CVD) method. The first resistance layer 119 is filled up to form a second resistance layer 121. At this time, the second resistance layer 121 may be an insulating layer with no current flow, and is preferably made of an oxide such as an oxide containing aluminum (Al) having a higher threshold drive voltage for switching phase than a threshold drive voltage for switching phase of the first resistance layer 119, i.e., the niobium containing oxide layer. Preferably, the oxide containing Al consists mainly of $Al_2O_3$, and may be formed by a chemical vapor deposition (CVD) process.

An upper electrode 123 is formed over the first and second resistance layers 119 and 121. The lower electrode is composed of a material selected from platinum group elements, for example, Pt and Ir. Next, a third Interlayer insulating film 125, which has the contact plug 127 overlapping with the lower electrode 115, is formed over the upper electrode 123. At this time, the contact plug 127 may partially overlap with the lower electrode 115.

Figure 4:
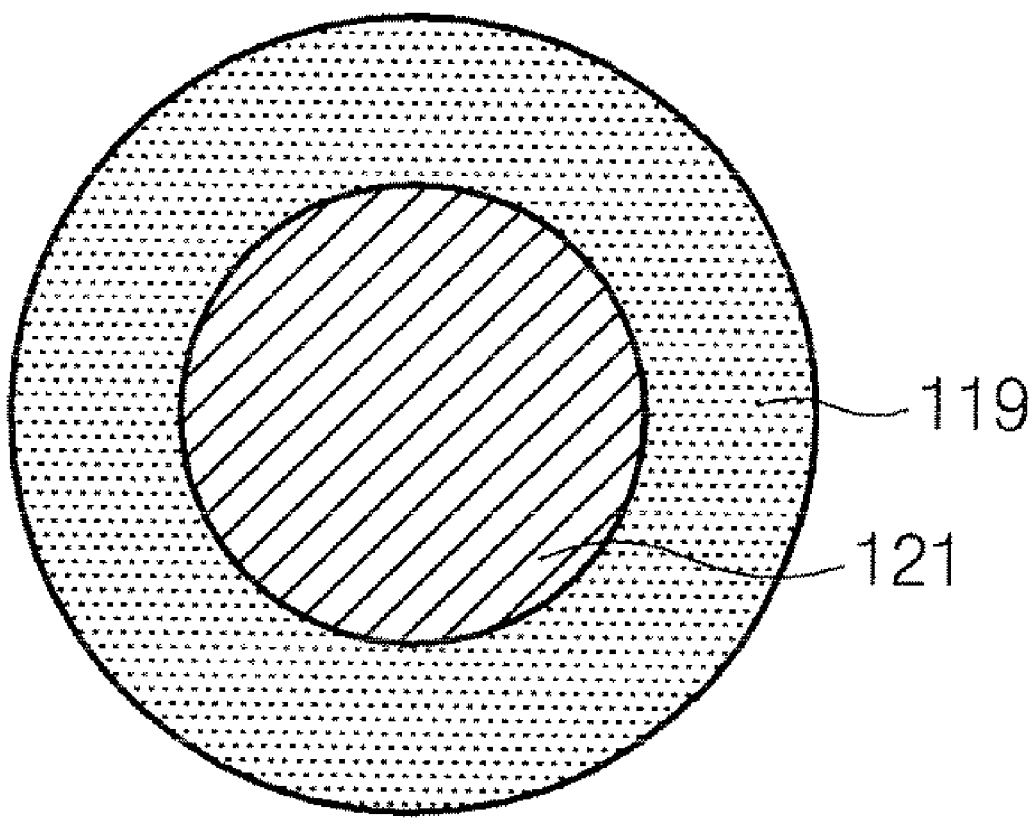
FIG. 4 is a plan view taken along the cut plane A-A' of FIG. 3.

FIG. 4 is a plan view taken along the cut plane A-A' of FIG. 3. As shown in the drawing, the first resistance layer 119 is formed in a ring shape, and the second resistance layer 121 is formed inside the first resistance layer 119.

Figure 5:
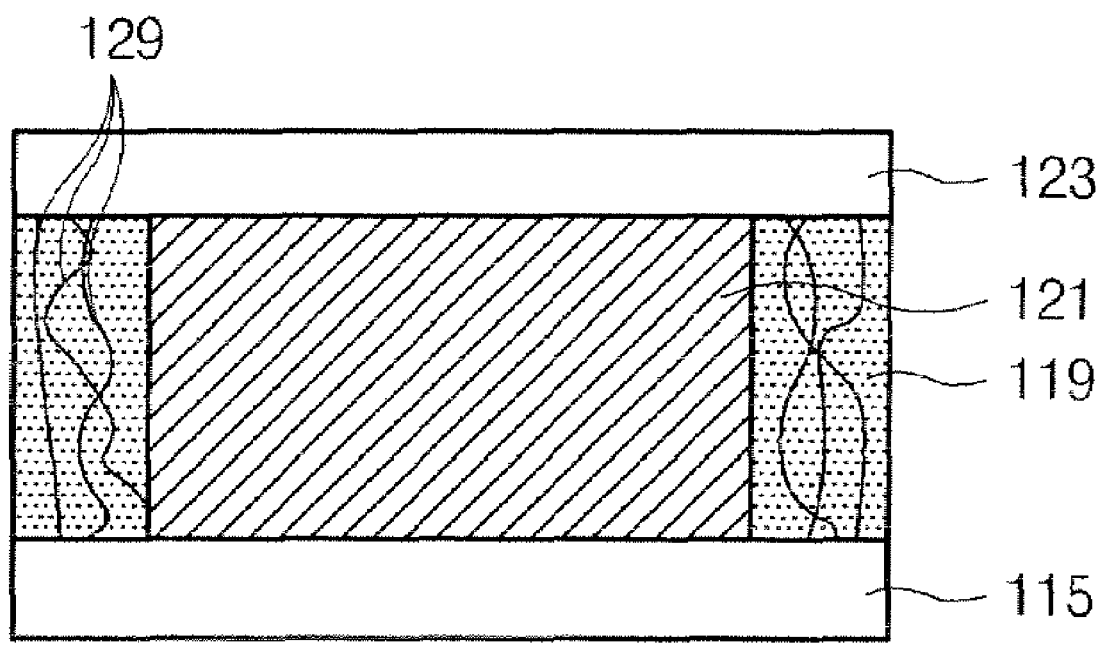
FIG. 5 is a plan view explaining the operating principles of a nonvolatile memory device, in accordance with a preferred embodiment of the present invention.

FIG. 5 is a plan view explaining the operating principles of a nonvolatile memory device, in accordance with a preferred embodiment of the present invention. As shown an embodiment of ReRAM in accordance with the present invention exists as an insulator ("0" resistance state) in its intrinsic state. However, when a voltage higher than a threshold drive voltage (Vt) is applied from outside through the contact plug 127, a current path 129 is formed inside the first resistance layer 119, causing the phase of the ReRAM to change into a metal/semiconductor state ("1" resistance state).

Since the first resistance layer 119 is preferably formed on sidewalls of the second contact hole, the current path 129 at the time of application of the threshold drive voltage (Vt) from outside is formed at the edges. Therefore, the dispersion of the threshold drive voltage (Vt) is narrowed, and it becomes possible to ensure uniform operating characteristics of the device.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device, comprising:
   a first electrode;
   a first resistance layer formed along an edge of the first electrode;
   a second resistance layer filled inside the first resistance layer; and
   a second electrode formed over the first and second resistance layers;
   wherein the material forming the second resistance layer has a threshold drive voltage for switching phase higher than the threshold drive voltage for switching phase of the material forming the first resistance layer.

2. The nonvolatile memory device of claim 1, wherein the first electrode and the second electrode comprise platinum group elements.

3. The nonvolatile memory device of claim 2, wherein the platinum group elements are selected from the group consisting of platinum (Pt), iridium (Ir) and metallurgical equivalents of platinum and iridium.

4. The nonvolatile memory device of claim 1, wherein the first resistance layer comprises an oxide containing niobium (Nb).

5. The nonvolatile memory device of claim 4, wherein the oxide containing Nb consists mainly of $NbO_2$ or $Nb_2O_5$.

6. The nonvolatile memory device of claim 1, wherein the second resistance layer comprises an oxide containing aluminum (Al).

7. The nonvolatile memory device of claim 6, wherein the oxide containing Al consists mainly of $Al_2O_3$.

8. The nonvolatile memory device of claim 1, wherein the first resistance layer is formed over an upper edge of the first electrode.

* * * * *